United States Patent [19]

Haferd

[11] Patent Number: 4,794,369
[45] Date of Patent: Dec. 27, 1988

[54] MULTI-FUNCTION ELECTRICITY METERING TRANSDUCER

[75] Inventor: James E. Haferd, Columbus, Ohio

[73] Assignee: Scientific Columbus, Inc., Columbus, Ohio

[21] Appl. No.: 660,380

[22] Filed: Oct. 12, 1984

Related U.S. Application Data

[63] Continuation of Ser. No. 352,106, Feb. 25, 1982, abandoned.

[51] Int. Cl.$^4$ .............................................. H03M 1/00
[52] U.S. Cl. ................................... 341/166; 324/141;
324/142; 358/138; 328/151; 364/178; 364/483;
341/123; 341/118
[58] Field of Search .... 340/347 M, 347 AD, 347 CC,
340/347 M, 347 C; 364/483, 178, 179; 324/142,
141; 358/138; 328/151

[56] References Cited

U.S. PATENT DOCUMENTS

| | | | |
|---|---|---|---|
| 3,244,808 | 4/1966 | Roberts | 358/133 |
| 3,484,591 | 12/1969 | Trimble | 364/734 X |
| 3,914,760 | 10/1975 | Logue | 340/347 M X |
| 3,984,829 | 10/1976 | Zwack | 340/347 C |
| 4,213,134 | 7/1980 | Chen | 307/353 X |
| 4,276,605 | 6/1981 | Okamoto et al. | 364/481 X |
| 4,345,311 | 8/1982 | Fielden | 324/142 X |

OTHER PUBLICATIONS

Kerchner et al., Alternating-Current Circuits, J. Wiley & Sons, Inc., 1938, pp. 52-55; 187-189.
The Engineering Staff of Federal Scientific Corp., Dithering Increases Dynamic Range . . . , 8/1973, pp. 1-8.
Gray et al., Companded Pulse-Code Modulation Voice Codec . . . , IEEE Journal of Solid-State Circuits, 12/1975, pp. 497 and 498.
Millman et al., Pulse and Digital Circuits, McGraw-Hill Book Co., Inc., 1956, pp. 323-335.

Primary Examiner—T. J. Sloyan
Attorney, Agent, or Firm—Frank H. Foster

[57] ABSTRACT

An electricity metering transducer is disclosed which samples voltages and currents at an innerconnection terminal of an electrical energy distribution system, converts those samples to digital form and computes selected electricity metering quantities. In a multiphase system current and voltage signals are multiplexed to a pair of codecs, one for current signals and one for voltage signals. The period of the signals being sampled is detected and used to generate a substantially nonsynchronous sampling signal so that a sample migration system is created which provides a large number of samples of a composite wave form. The steps of a digitally generated stepwise approximation of a sawtooth waveform are summed with the sequential analog samples and then removed from the digital value of each sample by software operation in order to increase the resolution of the digital to analog conversion.

4 Claims, 5 Drawing Sheets

FIG.1

$$\text{REACTIVE POWER (VARS)} = \left( \frac{1}{N} \sum_{t=0}^{N} e_{\phi,t} \, i_{\phi,t-1} \right) \quad \text{FIG. 2A}$$

$$\text{REAL POWER (WATTS)} = \left( \frac{1}{N} \sum_{t=0}^{N} e_{\phi,t} \, i_{\phi,t} \right) \quad \text{FIG. 2B}$$

$$VA = \sum_{\phi=a}^{c} \sqrt{(WATTS_\phi)^2 + (VARS_\phi)^2} \quad \text{FIG. 2C}$$

$$V \approx \sqrt{\frac{1}{3} \sum_{\phi=a}^{c} \frac{1}{N} \sum_{t=0}^{N} V_{\phi,t}^2} \quad \text{FIG. 2D}$$

MULTI-FUNCTION ELECTRICITY METERING TRANSDUCER

This is a continuation of application Ser. No. 352,106, filed Feb. 25, 1982, abandoned.

TECHNICAL FIELD

This invention relates to metering for electricity energy distribution systems and more particularly relates to an electronic, solid-state, multi-function meter which can be used as a multi-function transducer or combined with additional components to provide a revenue or billing meter.

BACKGROUND ART

This application is a continuation in part of my previously filed co-pending application Ser. No. 256,058 filed Apr. 21, 1981.

In the electrical energy industry various quantitative measurements are needed and are traditionally obtained from a variety of different devices. Each device is designed and contructed to meter a particular quantity. For example, the historic Ferraris rotating meter was used in a variety of forms to measure real or reactive energy and with uniquely designed attachments measures the rate and power demand quantities. Electronic kilowatt and kilovar transducers when coupled with circuitry for integrating with respect to time are also used for these purposes.

With conventional technology, a power company orders and installs those devices or transducers which provide the quantities which are desired. Some manufacturers have combined more than one type of transducer into an aggregation of such devices in a single piece of equipment. U.S. Pat. No. 4,218,737 shows two different transducers combined in a circuit which converts each of their analog outputs to digital form and then processes, stores, communicates and displays the processed data.

Prior art analog/digital conversion techniques include the sampling of a periodic analog signal such as an audio signal in a communication system.

We have found that one of the major difficulties which is experienced in attempting to apply sampling techniques to electricity metering is in obtaining metered quantities with the high accuracy which is needed for revenue metering.

BRIEF SUMMARY OF THE INVENTION

A high degree of accuracy is obtained, especially for distorted waveforms with the combination of the features and techniques of the present invention. The sampling rate is increased to improve accuracy, by utilizing high speed A/D converters called codecs which are manufactured for communication purposes. Multiphase signals are preferably multiplexed to pair of such codecs, one for currents, one for voltages. A sample migration technique is used which effectively provides a great number of sample positions spaced throughout a composite cycle of the electricity distribution system signal. Resolution of the codecs is increased by summing the analog samples with the levels of a stepwise approximation of a sawtooth and then digitally subtracting the sawtooth.

DESCRIPTION OF BLOCK DIAGRAM CIRCUITRY

Figure 1:
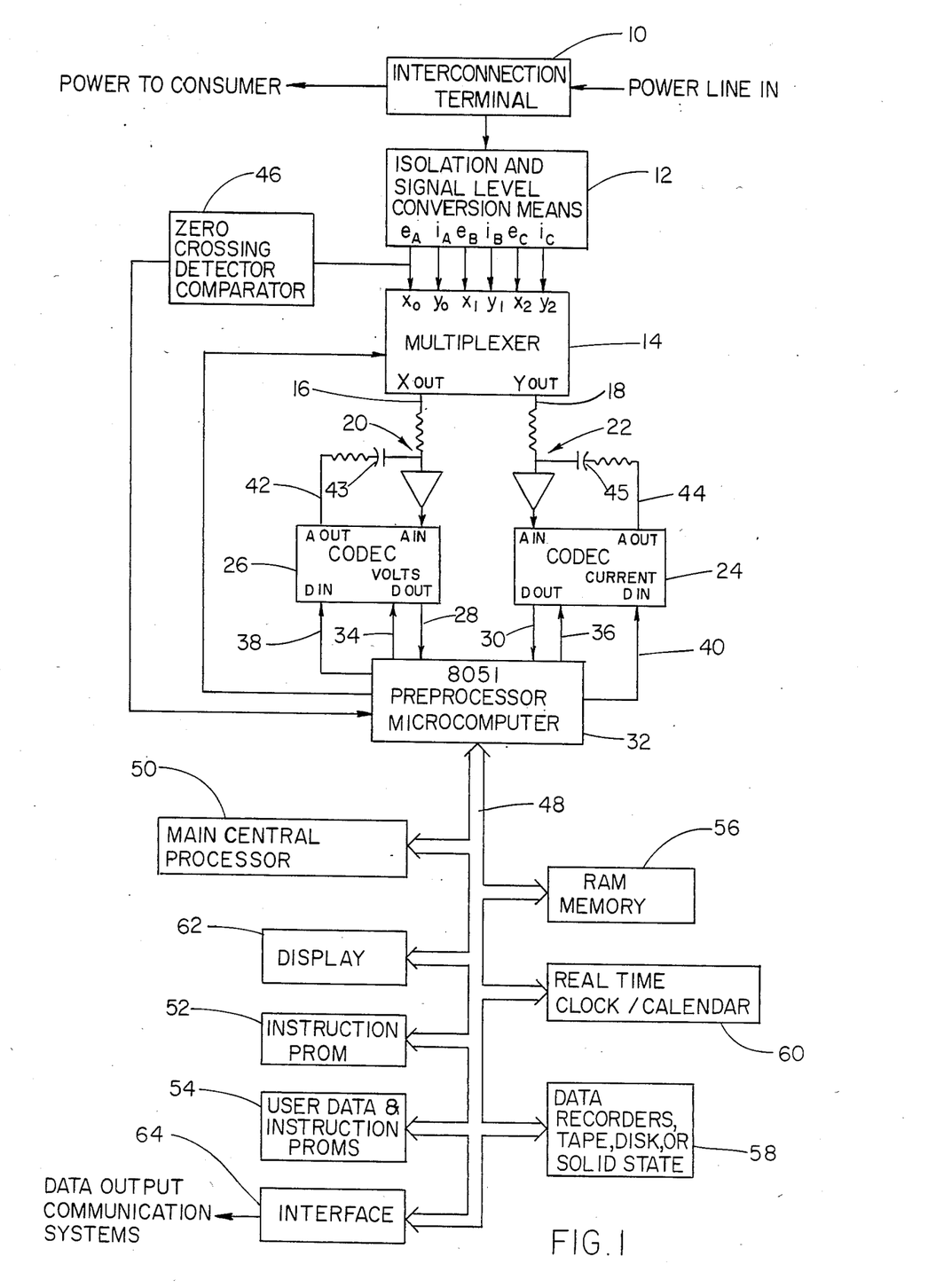
FIG. 1 is a block diagram illustrating the preferred embodiment of the invention.
Figure 2A:
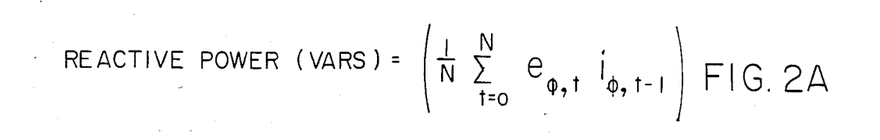
FIG. 2 is a table of equations illustrating some arithmetic operations performed in the preferred embodiment of the invention.
Figure 2B:
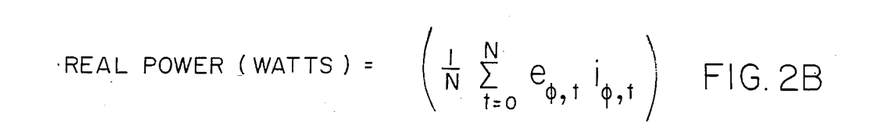
Figure 2C:
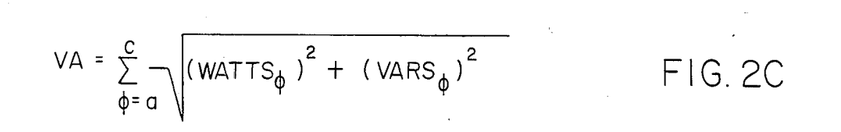
Figure 2D:
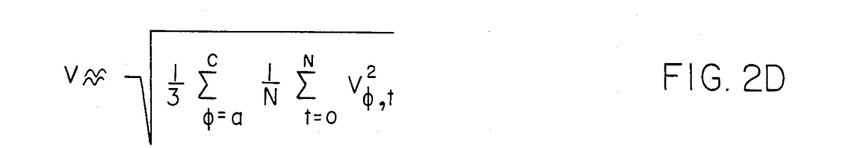

FIG. 1 illustrates the preferred embodiment of the invention connected into a power distribution system. It may be connected, for example, to meter the energy supplied to a particular customer or it may be connected at an interconnect between two different utilities.

An interconnection terminal 10 is provided by which the metering circuitry of the present invention is interconnected to the power distribution system. An isolation and signal level conversion means 12, such as the conventional plurality of transformers, is connected to the interconnection terminal 10 for providing DC isolation from the power distribution system and amplitude reduction to amplitudes which are compatible with the solid state circuitry. At its outputs it provides voltages and currents for each of the input phases.

These output voltages and currents are applied to the inputs of a multiplexer 14. As illustrated, the voltage signals are multiplexed to a voltage output terminal 16 while the current signals are multiplexed to the current output terminal 18. The multiplexer is operated to simultaneously connect the voltage and current of a single phase to the multiplexer output and to periodically sequence through these voltages and currents of all the phases on a rotational basis.

These simultaneous voltage and current output pairs at the terminals 16 and 18 are applied to analog summing circuits 20 and 22. Each analog output signal from the multiplexer is summed with a periodic sawtooth signal.

The sum of the sawtooth signal and the analog signal is applied to a coder/decoder type of A/D converter known as a codec. One codec 24 receives the current signal sum and the other codec 26 receives the voltage signal sum. The sums are applied to the analog input of the A/D portion of each codec. The digital output terminals 28 and 30 of the codecs 26 and 24 are connected to input ports of a preprocessing microcomputer 32 which is preferably a type 8051.

The control inputs 34 and 36 to the codecs 26 and 24 are connected to output ports of the preprocessor 32 so that they are controlled by the preprocessor 32. Similarly, the multiplexer is also connected to the preprocessor 32 for control by it.

As described more completely below preprocessor 32 generates in digital form a step wise approximation of a sawtooth signal. This digital sawtooth is generated as a series of digital words which are serially output to the digital inputs 38 and 40 of the D/A portions of the codecs 26 and 24. Each codec then converts each word to its corresponding level and together they provide the sawtooth which is applied from the codec analog outputs 42 and 44 through DC removing capacitances 43 and 45 to the analog summing circuits 20 and 22. The analog sawtooth signals are summed with the analog signals appearing at the outputs 16 and 18 of the multiplexer 14.

A comparator circuit 46 is used as a zero crossing detector. Its input is connected to one of the outputs of the isolation and signal level conversion means 12. As illustrated it is preferably connected to a signal which is proportional to the voltage of one phase of the power distribution system. The zero crossing detector 46 compares that instantaneous voltage to zero volts for detecting when the voltage of that phase makes a transition from a positive voltage to a negative voltage, that is when it passes through the zero volt level. Upon detection of that zero volt transition, the output state of the zero crossing detector 46 changes and that change of state is applied to an input port of the preprocessor 32.

As also illustrated in FIG. 1, the preprocessor 32 is connected through a conventional data, address and control but 48 to a main central processing unit 50 as well as a variety of memory components in the form of an instruction prom 52, other data and instruction proms 54, ram memory 56 and data recorders 58 such as tape, discs or solid state memories. The bus also connects the central processor 50 with a real time clock and calendar 60, display circuitry 62 and an interface 64 for permitting the output of data from the system in communication with other systems.

The codecs 24 and 26 are preferably companding codecs such as the MK5116 sold by Mostek. A companding codec has a transfer characteristic which results from the fact that its range of analog values is divided into amplitude intervals called chords. The chords are arranged logarithmically to the base two. The range or span of each chord is double that of its immediate lower predecessor. Each chord is divided into 16 step values. There are 8 positive and 8 negative chords. Each analog level is specified by a 0 or a 1 indicating a plus or minus signal, three chord bits and four step value bits.

Each codec is a coder/decoder which means one portion of each codec encodes an analog signal, that is converts it from analog to digital form, and the other portion decodes it, that is converts it from digital to analog form. The analog to digital portion uses the conventional rounding off technique. It converts each analog sample level to the nearest adjacent discrete incremental level in accordance with the bit resolution of the A/D converter.

Instead of using a multiplexer, one codec could be used for each of the current and voltage signals of each phase. In that event the multiplexing function would effectively be performed by the preprocessing microcomputer 32.

Circuit Operation

In the operation of the preferred embodiment illustrated in FIG. 1, the current and voltage signals of each phase are sequentially applied by the multiplexer in simultaneous pairs for each phase to the summing circuits 20 and 22.

Although the analog current and voltage signals are summed with the sawtooth referred to above, for purposes of initial discussion it may be assumed that the analog signals from the multiplexer 14 are essentially the same at the analog inputs to the codecs. Thus, for purposes of initial explanation, the sawtooth signal may be considered to be small relative to the analog signals.

The analog current and voltage signals are converted to digital form by codecs 24 and 26 under the control of the preprocessor 32. Although analog input signals are continuously applied to the analog input terminals of the codecs, the actual sample taking over a short interval is accomplished in the control of the codec by the preprocessor 32 which actuates the sample taking by each codec. The data for each sample is then serially output from the codec to the preprocessor 32.

For each voltage sample the preprocessor 32 computes the square of the voltage and adds it to an accumulator. A single accumulator sums the voltage square for all phases. Because the voltages for all phases are approximately equal, the per phase voltage can later be determined to a reasonable approximation. The real power and the reactive power are also computed for each phase in accordance with the equations I and II and then added to the appropriate one of six accumulators, one for real power for each phase and one for reactive power for each phase. In addition to the seven accumulated quantities described above, a timer/counter accumulates the elapsed time interval over which the samples were taken. This corresponds to N in the equations of FIG. 2. Therefore, in summary, there are preferably eight accumulators for a three phase system.

To use the circuitry as a transducer, each of these quantities may then be output either by display or communication to further circuitry so that the device at the output of the preprocessor 32 would provide data for voltage, current, real power and reactive power. We prefer that it also be connected to the main computer 50 and other circuitry structure illustrated in FIG. 1 so that further computations can be made from this data to provide all of the variety of data which is used by the art for billing purposes.

FIG. 2 illustrates the equations used by the preprocessor 32 and the main microprocessor 50 in computing the voltage, current, power and reactive power for all three phases. The results of those computations may be used in making further computations of the other quantities desired by the art. the preprocessor 32 illustrated in FIG. 1 does not do all of the calculations. Instead, the values described above together with the elapsed time are merely output through the bus 48 to the main processor 50 when a request signal is transmitted by the main computer 50. It then completes the calculations and makes the additional ones. The accumulations in the preprocessor 32 are reset to zero and operation continues.

Because even codecs are limited in the speed with which they can perform their operations, only a limited number of samples may be taken during each cycle of the electricity distribution system. However, by taking the samples at different positions in successive cycles, a considerably greater number of sample positions are used over a composite cycle. It is therefore desirable that the sample position migrate along the composite waveform as succeeding samples are taken in order to obtain a large number of sample positions.

This is accomplished in the present invention by choosing a sampling frequency which is relatively asynchronous with the electricity distribution system. The frequency of the distribution system signal is continuously monitored and from it a frequency is calculated which is not an integral multiple of the distribution system frequency. This causes the sample positions to migrate throughout the composite waveform cycle.

By selecting the sampling frequency in accordance with the present invention, sample migration may be accomplished for improving the accuracy of the metered quantities and at the same time permitting simple yet accurate determination of the quantities of current voltage, volt-amps, real power and reactive power at an interconnection point in the supply line regardless of whether the load is wye or delta connected.

As is well known to those skilled in the art, the line currents observed at an interconnection point in the line are not the same as the currents in a delta connected three phase load. Therefore, metered quantities such as VA, which depend upon current cannot be obtained directly from the current samples.

However, the values of reactive power in Vars and real power in Watts as calculated from equations I and II of FIG. 2 can be used to compute volt-amperes in accordance with equation III.

As can be seen in equation II, real power for each phase is computed by multiplying the instantaneous voltage and current samples for each sample pair for each phase and summing or accumulating these N products for each phase and dividing the accumulated products by N, the number of samples.

As seen in equation I, reactive power is the component in quadrature with the real power. Reactive power is therefore the product of an instantaneous voltage sample multiplied by the current which leads the voltage by 90°, that is with an instantaneous current sample which is 90° ahead of the voltage sample.

Therefore, if the consecutive samples for each phase can be taken at 90° intervals, then the reactive power may be determined by multiplying each voltage sample by the immediately preceding current sample for the same phase. Because the samples of each phase are taken in rotational sequence, if a sample is taken every 30° then each phase will be sampled every 90°. This is illustrated in FIG. 4(D).

This is accomplished by first detecting the period of the distribution system signal. The period is detected by the preprocessor which times the time elapsed between the detected zero crossings. This is done simply by initiating the operation of a timer at one negative transition and stopping the timer when the next negative transition is detected. The elapsed time is thus the period of the distribution signal.

The preprocessor then divides that period of the distribution signal by four times the number of phases times an integer to give a sample period which will space the samples for each phase every 90°. For a three phase system, the distribution signal period is divided by 12 to space the samples every 30° which is every 90° for each phase. For example, if the distribution system signal is exactly 60 HZ the sample period which would give exactly a 90° spacing of samples in each phase will be 1.388 milliseconds (not rounded off).

In order to accomplish the desired sample migration, a second time interval is then added to the first time interval. The second time interval is small relative to the first time interval and in the preferred embodiment is one microsecond. This sum of the small second time interval and the first time interval is then used by the preprocessor 32 as the period of the sampling signal when it generates the sampling signal.

In the preferred embodiment, if the distribution system signal is exactly 60 HZ the sample period would become 1.389 milliseconds. It should be noted that adding a small time interval would include adding a negative small time interval, for example subtracting one microsecond to give a sample period of 1.387 milliseconds.

The result of adding this small second time interval is that each sample is spaced 1 microsecond beyond the spacing which would give exactly 30° spacings between all samples. Thus, for each phase, samples are 3 microseconds from being exactly 90° apart. However, this error has an insignificant effect on phase shift accuracy yet causes the sample migration which greatly increases the accuracy of the metered quantities.

It should be remembered that, although the samples migrate, all samples are migrating so that a particular sample of a phase is always no more than 3 microseconds away from being 90° phase shifted from its immediately preceding sample. Due to the migration of the samples during successive cyles of the distribution system signal, samples will be spaced every one microsecond over a composite cycle representing many cycles of distribution system signals.

The migration sequence will repeat each time a sample migrates through a total of 90°. Therefore, if the distribution system signal is exactly 60 HZ then 90° represents 4,166 microseconds. Since the samples are spaced at 1 microsecond intervals, there will be 4,166 spaced sample positions for the composite cycle. Since one sample is taken every 1.389 milliseconds then 4,166 samples will require 5.78 seconds. Thus, the samples will migrate through all 4,166 samples each 5.78 seconds.

We have found source of inaccuracy with the codecs which is related to the fact that they, like most A/D converters, round-up or round-down an analog sample to whichever of the adjacent, discrete, incremental levels is nearest. Because the digital samples are accumulated, the error is also cumulative.

This error is significantly reduced in the present invention by generating a pair of analog sawtooth signals, one for voltage and one for current. Different levels of the sawtooth are added at different times to different samples of the identical signal. Each sum is converted to digital form and then the value of the sawtooth in digital form is subtracted out. The differences are then time integrated.

In order to accomplish this the sawtooth is generated in digital form by the preprocessor 32. The sawtooth is generated by first detecting the peak amplitude of the voltage signal and the peak amplitude of the current signal from one phase of the electrical energy signal. These peak values are then used to generate two different sawtooths, one for the volts summing circuit 20 and one for the current summing circuit 22. The peak value is detected by the preprocessor by examination of all of the samples in companded form to determine the largest.

After obtaining the peak sample in digital, companded form the preprocessor then decrements the four chord bits for the largest sample by four if the peak is located in the 5th, 6th, 7th or 8th chord. If the peak is in the 3rd or 4th chord the chord word is decremented to the first chord and if the peak is in the 1st or 2nd chord no sawtooth is generated. The chord word, decremented as described, is then used as the chord word for the sawtooth.

The purpose of decrementing the chord word is to obtain a sawtooth having a peak to peak value which is equal to the amplitude interval between the discrete incremental levels of the chord in which the peak was measured.

The preprocessor 32 also generates successive 4 bit step value words for generating the sawtooth by incrementing a 4 bit counter. Each step value word corresponds to a different one of the 16 levels of the chord. The chord word derived as described is output with each of the 16 step value words to generate in digital form a step wise approximation to a sawtooth signal illustrated in FIG. 4a.

Figure 4A:
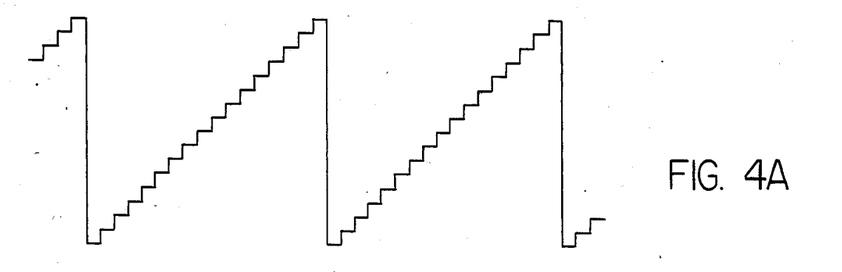
FIGS. 4A-4C are graphical representations of the operation of the preferred embodiment of the invention.
Figure 4B:
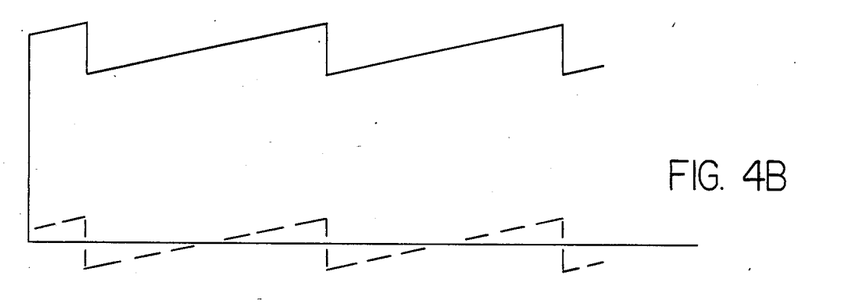

This digital step wise approximation of a sawtooth signal illustrated in FIG. 4a is applied to the digital input of the digital to analog section of the codec. The codec converts this companded digital input to an analog output signal which is illustrated in solid lines in FIG. 4b.

Because of the companding transfer function of the codec, the sawtooth has a substantial average or DC value corresponding to the center of the chord. This average value is eliminated from the analog form by the capacitances 43 and 45 to provide a sawtooth 101 illustrated in broken lines FIG. 4b which is then summed with the analog signal from the multiplexer.

Figure 4C:
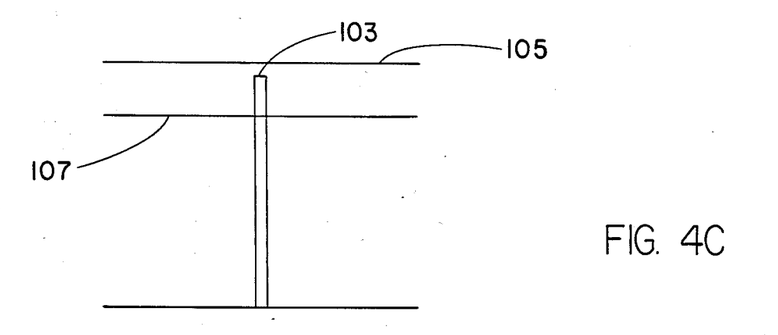
Figure 4D:
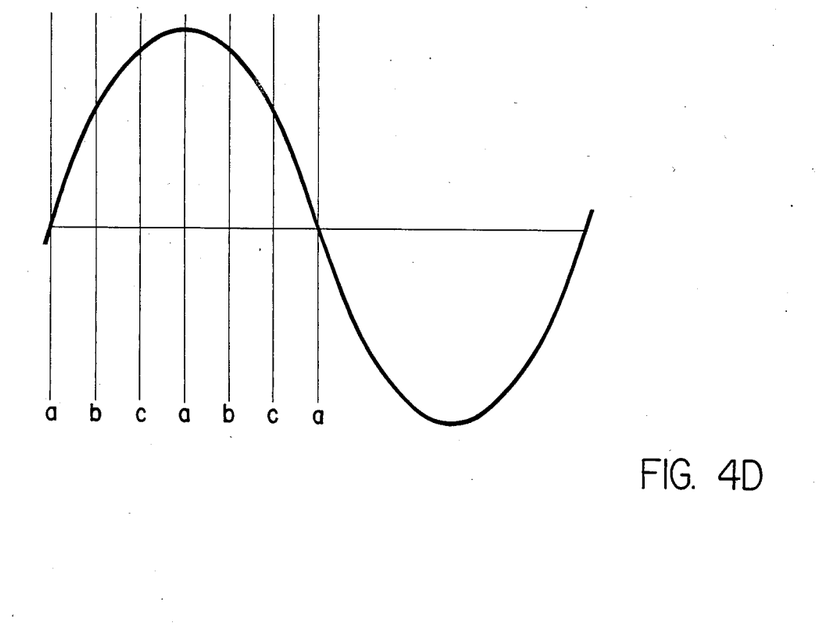

FIG. 4c illustrates an analog sample 103 which is intermediate two adjacent discrete incremental levels, 105 and 107 which are characteristic of A/S converters.

As is well known in the art, the A/D converter, for each sample having the amplitude of sample 103, will always generate a digital word corresponding to the discrete level 105 because of the rounding characteristic. The error of the difference between level 103 and level 105 will accumulate in the accumulators as the data is accumulated.

If, however, successive samples of the signal of level 103 are summed with each of 16 levels of the sawtooth 101, then some of the digital output words from the A/D converter will correspond to level 105 while others will correspond to level 107. The number of samples falling at the positions 105 and 107 levels respectively will be proportional to the proportional spacing of the level 103 from the levels 105 and 107. Therefore the accumulated error described above is eliminated and resolution is increased to the resolution of the 16 steps of the sawtooth.

The sawtooth is generated in synchronism with the sample frequency computed as above. Thus, due to the sample migration, each of the 16 different ramp levels will be summed with sequential samples for the same voltage or current for the same phase in sequential rotation.

Since the peak to peak amplitude of the sawtooth is selected to be equal to the distance between discrete incremental levels of the A/D converter only for the peak of a signal, it follows that for most samples the peak to peak value will be greater than the difference between the incremental levels. However, since the sawtooth is centered about zero the same proportional principle as described above will continue to apply.

It is desirable to subtract from each digital sample of the sum of the sawtooth level and a voltage or current signal, the digital value of the particular sawtooth level which was summed with the analog signal prior to the A/D conversion.

To determine the digital word representing the sawtooth level which was added to the analog sample, the 8 bit companded word used to generate that sawtooth level must be operated upon. Because a capacitance removed the DC level from the analog signal generated by that digital word, the digital value of the DC must first be subtracted from the digital word. This may be simply accomplished by providing a look-up table for the center level of each possible chord value of the companded 8 bit words. Because there are four chord bits and four step values, a look-up table can be prepared and stored in memory for each of the 256 different digital words. For each digital word representing the total sawtooth level, the look-up table provides the dc value to be subtracted from it to give the sawtooth level actually added to the analog sample. After that subtraction, the result is subtracted from the total detected sample to give the digital value of the sampled voltage or current before the sawtooth was added to it.

As stated above, the real power for each phase, the reactive power for each phase, the summation time of N samples and the accumulated voltage squared for all three phases are accumulated in the memory associated with the preprocessor 32. These are then used by the main processor 50 to determine voltage in accordance with equation IV, volt-amperes in accordance with equation III, current by dividing volt-amperes by voltage and all the other metering quantities which are well known to those skilled in the art.

Figure 3:
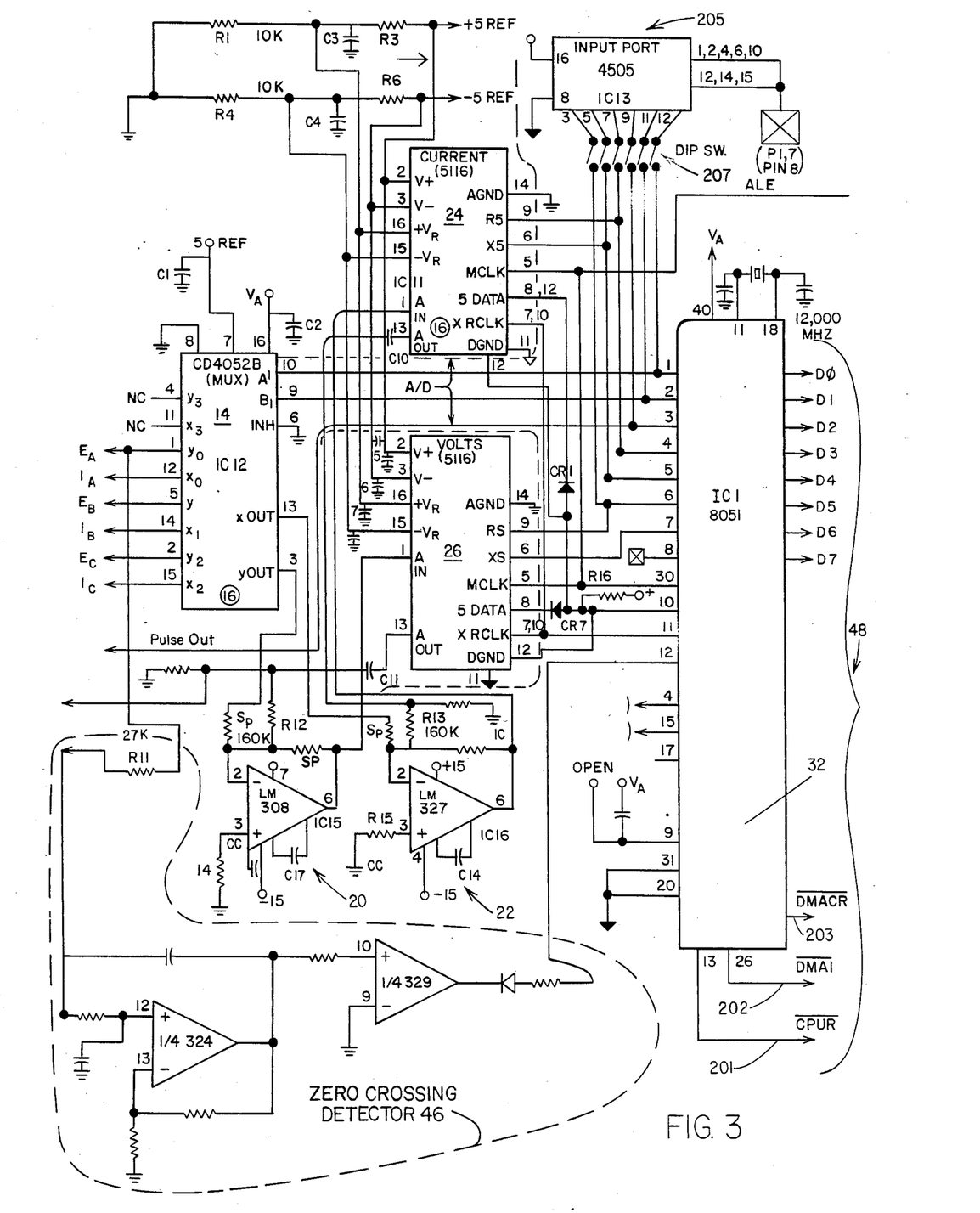
FIG. 3 is a schematic diagram showing the detail of a portion of the circuitry of FIG. 1.

FIG. 3 is a schematic diagram illustrating in detail the preferred embodiment of the invention. Reference numerals identical with those of FIG. 1 are inserted to point out the corresponding circuitry. Conductors 201, 202 and 203 additionally connect to the main microcomputer 50 for control of the preprocessor 32 and together with the data outputs D0 through D7 form a part of the data, control and address but 48 illustrated in FIG. 1

A scaling circuit 205 is connected to the data input ports of the preprocessor 32 to provide a series of manually selectable switches 207. The appropriate scaler input is manually selected for each installation so that the digital data may be multiplied by the proper conversion factor to convert the digital data bits to data representing the actual voltage and current values in the distribution system.

It is to be understood that while the detailed drawings and specific examples given describe preferred embodiments of the invention, they are for the purposes of illustration only, that the apparatus of the invention is not limited to the precise details and conditions disclosed and that various changes may be made therein without departing from the spirit of the invention which is defined by the following claims.

I claim:

1. An improved method for sampling the current and voltage signals of an electricity distribution system, converting said samples to digital form to provide a plurality of samples and machine computing selected electricity metering quantities from said samples, wherein the improvement comprises, generating a signal for controlling the sample rate by:
   (a) periodically detecting the period of said system signals as a numeric value represented by electronic signals;
   (b) dividing said numeric value of said system signal period by at least ten to obtain a first time interval; and
   (c) adding a second time interval to said first time interval to obtain a resulting numeric value, represented by electronic signals,, for the period of said control signal, said second time interval being small relative to said first time interval; and (d) generating a control signal for controlling the sample rate, said control signal generating a sampling period equal to said resulting numeric value.

2. A method in accordance with claim 1 wherein said period is detected within 1μ sec interval and wherein said second time interval is also 1μ sec.

3. An improved method for sampling the current and voltage signals of an electricity distribution system, converting said samples to digital form to provide a plurality of samples and machine computing selected electricity metering quantities from said samples, said improvement comprising:

(a) generating a sampling period signal for initiating the sampling at the period of said sampling period signal by periodically detecting the period of said electricity distribution system, dividing said system period by an integral multiple of four times the number of phases and adding a second time interval to said first time interval to obtain the period of said sampling period signal, said second time interval being small relative to said first time interval; and (b) detecting instantaneous reactive power for one phase by multiplying a voltage sample of the phase by a current sample of the phase taken substantially 90° preceding the voltage sample.

4. A method in accordance with claim 3 wherein the integral multiplier is one and said current sample was the immediately preceding sample for the phase.

* * * * *